United States Patent
Tsukihara et al.

(10) Patent No.: US 9,850,177 B2
(45) Date of Patent: Dec. 26, 2017

(54) SURFACE-COATED BORON NITRIDE SINTERED BODY TOOL

(71) Applicant: SUMITOMO ELECTRIC HARDMETAL CORP., Itami-shi (JP)

(72) Inventors: Nozomi Tsukihara, Itami (JP); Katsumi Okamura, Itami (JP); Makoto Setoyama, Itami (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 63 days.

(21) Appl. No.: 14/892,542

(22) PCT Filed: Jun. 5, 2014

(86) PCT No.: PCT/JP2014/064957
§ 371 (c)(1),
(2) Date: Nov. 19, 2015

(87) PCT Pub. No.: WO2015/001903
PCT Pub. Date: Jan. 8, 2015

(65) Prior Publication Data
US 2016/0194254 A1    Jul. 7, 2016

(30) Foreign Application Priority Data
Jul. 3, 2013 (JP) .................................. 2013-139797

(51) Int. Cl.
*C23C 14/06* (2006.01)
*C04B 41/89* (2006.01)
(Continued)

(52) U.S. Cl.
CPC .......... *C04B 41/89* (2013.01); *C04B 35/5611* (2013.01); *C04B 35/581* (2013.01);
(Continued)

(58) Field of Classification Search
USPC .......... 51/307, 309; 428/216, 336, 697, 698, 428/699, 704
See application file for complete search history.

(56) References Cited

U.S. PATENT DOCUMENTS 4,311,490 A * 1/1982 Bovenkerk .............. B01J 3/062
51/307
5,330,853 A * 7/1994 Hofmann ............ C23C 14/0084
428/697

(Continued)

FOREIGN PATENT DOCUMENTS

EP  0714719 A1  6/1996
EP  1736307 A1  12/2006

(Continued)

OTHER PUBLICATIONS

International Search Report in International Application No. PCT/JP2014/064957, dated Sep. 9, 2014.

(Continued)

*Primary Examiner* — Archene Turner
(74) *Attorney, Agent, or Firm* — Venable LLP; Michael A. Sartori; Miguel A. Lopez

(57) ABSTRACT

A surface-coated boron nitride sintered body tool is provided, in which at least a cutting edge portion includes a cubic boron nitride sintered body and a coating film formed on a surface of the cubic boron nitride sintered body. The coating film includes an A layer and a B layer. The A layer is formed of columnar crystals each having a particle size of 10 nm or more and 400 nm or less. The B layer is formed of columnar crystals each having a particle size of 5 nm or more and 70 nm or less. The B layer is formed by alternately stacking two or more compound layers having different compositions. The compound layers each have a thickness of 0.5 nm or more and 300 nm or less.

18 Claims, 2 Drawing Sheets

(51) Int. Cl.
*C04B 41/00* (2006.01)
*C04B 41/52* (2006.01)
*C04B 35/58* (2006.01)
*C04B 35/581* (2006.01)
*C04B 35/63* (2006.01)
*C04B 35/645* (2006.01)
*C04B 37/02* (2006.01)
*C23C 28/04* (2006.01)
*C04B 35/56* (2006.01)

(52) U.S. Cl.
CPC .. *C04B 35/58014* (2013.01); *C04B 35/58021* (2013.01); *C04B 35/6303* (2013.01); *C04B 35/645* (2013.01); *C04B 37/026* (2013.01); *C04B 41/009* (2013.01); *C04B 41/52* (2013.01); *C23C 14/0641* (2013.01); *C23C 14/0664* (2013.01); *C23C 28/042* (2013.01); *C23C 28/044* (2013.01); *C04B 2235/386* (2013.01); *C04B 2235/3843* (2013.01); *C04B 2235/3856* (2013.01); *C04B 2235/3886* (2013.01); *C04B 2235/402* (2013.01); *C04B 2235/404* (2013.01); *C04B 2235/5436* (2013.01); *C04B 2235/80* (2013.01); *C04B 2237/122* (2013.01); *C04B 2237/361* (2013.01); *C04B 2237/401* (2013.01)

(56) References Cited

U.S. PATENT DOCUMENTS

2006/0222893 A1 10/2006 Derflinger
2007/0275268 A1* 11/2007 Takaoka ................ C22C 26/00
428/698
2012/0090247 A1 4/2012 Miura
2012/0114437 A1* 5/2012 Andersson ............ C04B 41/009
407/119
2012/0234143 A1 9/2012 Fontaine et al.
2013/0034712 A1 2/2013 Kudoh et al.
2013/0108850 A1 5/2013 Kudo et al.

FOREIGN PATENT DOCUMENTS

| EP | 2000237 A1 | 12/2008 |
| EP | 2591869 A1 | 5/2013 |
| JP | 2008-188689 A | 8/2008 |
| JP | 2008-534297 A | 8/2008 |
| JP | 2008-254159 A | 10/2008 |
| WO | 01/36711 A1 | 5/2001 |
| WO | 2010/140959 A1 | 12/2010 |
| WO | WO-2010/150335 A1 | 12/2010 |
| WO | WO-2011/129422 A1 | 10/2011 |
| WO | WO-2012/005275 A1 | 1/2012 |

OTHER PUBLICATIONS

Extended European Search Report in counterpart European Patent Application No. 14819914A, dated Jan. 30, 2017.

* cited by examiner

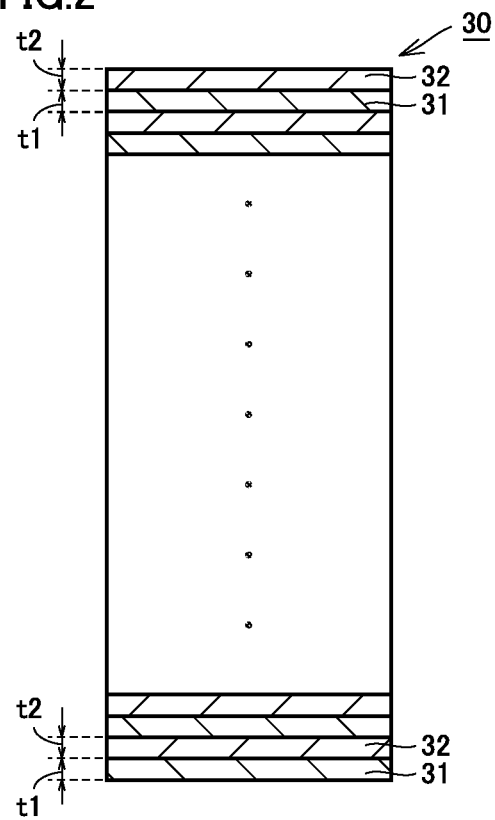

SURFACE-COATED BORON NITRIDE SINTERED BODY TOOL

TECHNICAL FIELD

The present invention relates to a surface-coated boron nitride sintered body tool, in which at least a cutting edge portion includes a cubic boron nitride (hereinafter also referred to as "cBN") sintered body and a coating film formed on the cBN sintered body.

BACKGROUND ART

There is a cutting tool formed of a cBN sintered body as a base member having a surface on which a coating film made of ceramics or the like is formed (which will be hereinafter also referred to as a "coated cBN tool"). This cutting tool exhibits excellent wear resistance, and therefore, is used for cutting processing of hardened steel.

As such a cutting tool, for example, WO2010/150335 (PTD 1) and WO2012/005275 (PTD 2) each disclose a tool formed of a cBN sintered body having a surface coated with a coating film including a lower layer formed of multiple layers having specific ceramic compositions and an upper layer formed of a compound layer.

Furthermore, a base member of a tool having a coating film is formed not only of a cBN sintered body, for example, but also of cemented carbide and the like (Japanese Patent Laying-Open No. 2008-188689 (PTD 3) and Japanese Patent National Publication No. 2008-534297 (PTD 4)).

CITATION LIST

Patent Document

PTD 1: WO2010/150335
PTD 2: WO2012/005275
PTD 3: Japanese Patent Laying-Open No. 2008-188689
PTD 4: Japanese Patent National Publication No. 2008-534297

SUMMARY OF INVENTION

Technical Problem

Recently, cutting processing is requiring extremely high precision. The precision required in this case is that a work material after processing exhibits excellent surface roughness to such an extent that finish processing such as polishing is not required after the cutting processing. In other words, cutting processing is required to also provide finish processing, unlike the conventional technique. Therefore, the cutting distance, at which prescribed surface roughness can be maintained (which will be hereinafter also referred to as a "surface roughness life"), is recently regarded as an essential feature for determining the tool performance. The conventional cutting tool, however, has not yet come to have a surface roughness life that can sufficiently satisfy the current users. Therefore, the surface roughness life is often simply regarded as a tool life under the current circumstances, and it is strongly desired to increase the surface roughness life.

Various factors that exert influences upon the surface roughness of the work material may be conceivable. Among others, the shape change of the insert resulting from wear is considered as a particularly influential factor. Accordingly, improving the wear resistance is considered as effective for increasing the surface roughness life.

Until now, there have been developed cutting tools with wear resistance improved by forming a coating film on the surface of the base member. For example, there is a cutting tool formed of a base member made of cemented carbide having a surface on which a coating film is formed. It is known that this cutting tool exhibits suitable wear resistance in steel processing.

In high precision processing of hardened steel higher in hardness than steel, however, sufficient surface roughness life could not be obtained even if a coating film was formed, similarly to cemented carbide, on the surface of the base member made of a cBN sintered body. Thus, in the present circumstances, there has not yet been developed a cutting tool implementing a long life in high precision processing of hardened steel.

The present invention has been made in light of the above-described circumstances. An object of the present invention is to provide a coated cBN tool implementing high dimensional precision and having an excellent tool life in processing of a hard material such as hardened steel.

Solution to Problem

In order to solve the above-described problems, the present inventors have processed hardened steel using a coated cBN tool covered with a coating film having various chemical compositions and crystal structures and formed in various layer-stacking manners, and they also carried out detailed analysis of the damaged state of the tool. The results showed that, in addition to normal crater wear and flank face wear, boundary wear also occurred in the front boundary portion corresponding to one end of the wear portion. Also, the present inventors found that this boundary wear exerted the most significant influence upon the surface roughness life.

In addition to the above, the present inventors have conducted repeated studies based on their findings described above. As a result, they also found that the most effective way to suppress boundary wear was to form a coating film obtained by stacking layers formed of crystal grains each having a specific composition, shape and particle size. Consequently, the present inventors have completed the present invention.

Specifically, the surface-coated boron nitride sintered body tool of the present invention has configurations (1) to (10) described below.

(1) At least a cutting edge portion includes a cubic boron nitride sintered body and a coating film formed on a surface of the cubic boron nitride sintered body.

(2) The cubic boron nitride sintered body includes 30 vol % or more and 80 vol % or less of cubic boron nitride particles, and further includes a binder phase including: at least one compound selected from the group consisting of nitride, carbide, boride, oxide, and solid solutions thereof in group 4 elements, group 5 elements and group 6 elements in a periodic table; an aluminum compound; and inevitable impurities.

(3) The coating film includes an A layer and a B layer.

(4) The A layer is formed of columnar crystals, and includes $ML_{za1}$ (M represents one or more of group 4 elements, group 5 elements and group 6 elements in the periodic table, Al and Si; La represents one or more of B, C, N, and O; and za1 is 0.85 or more and 1.0 or less).

(5) The B layer is formed of columnar crystals, and formed by alternately stacking one or more of each of two or more compound layers having different compositions.

(6) The compound layers each have a thickness of 0.5 nm or more and 300 nm or less.

(7) A B1 compound layer that is one of the above-described compound layers includes $(Ti_{1-xb1-yb1}Si_{xb1}M1_{yb1})(C_{1-zb1}N_{zb1})$ (M1 represents one or more of group 4 elements except for Ti, group 5 elements and group 6 elements in the periodic table, and Al; xb1 is 0.01 or more and 0.25 or less; yb1 is 0 or more and 0.7 or less; and zb1 is 0.4 or more and 1 or less).

(8) A B2 compound layer that is one of the above-described compound layers and different from the B1 compound layer includes $(Al_{1-xb2}M2_{xb2})(C_{1-zb2}N_{zb2})$ (M2 represents one or more of group 4 elements, group 5 elements and group 6 elements in the periodic table, and Si; xb2 is 0.2 or more and 0.7 or less; and zb2 is 0.4 or more and 1 or less).

(9) The A layer has a thickness of 0.2 μm or more and 10 μm or less, the B layer has a thickness of 0.05 μm or more and 5 μm or less, and the coating film has an entire thickness of 0.3 μm or more and 15 μm or less.

(10) A particle size Wa of each of the columnar crystals included in the A layer is 10 nm or more and 400 nm or less, and a particle size Wb of each of the columnar crystals included in the B layer is 5 nm or more and 70 nm or less.

Advantageous Effects of Invention

The surface-coated boron nitride sintered body tool of the present invention implements high dimensional precision and has an excellent tool life in processing of a hard material such as hardened steel.

BRIEF DESCRIPTION OF DRAWINGS

FIG. 2 is a cross-sectional view showing an example of the configuration of a main part of the surface-coated boron nitride sintered body tool according to the present embodiment.

DESCRIPTION OF EMBODIMENTS

Figure 1:
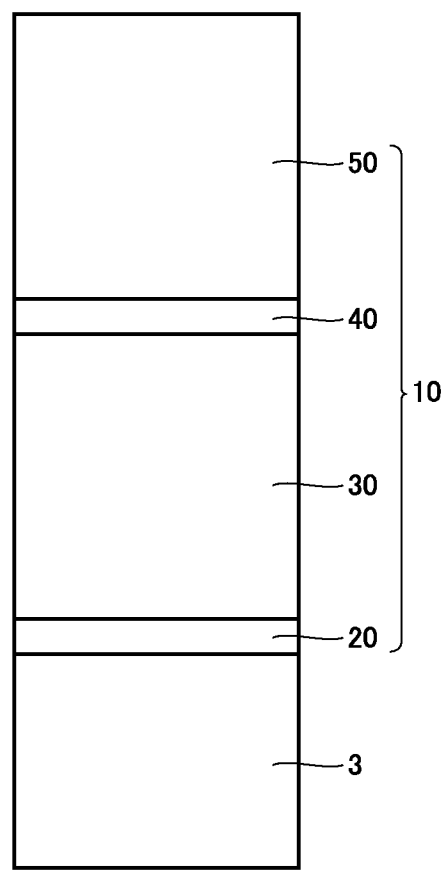
FIG. 1 is a cross-sectional view showing an example of the configuration of a surface-coated boron nitride sintered body tool according to the present embodiment.

The embodiments according to the present invention will be hereinafter described in greater detail. While the following explanation will be made with reference to the accompanying drawings, the same or corresponding components are designated by the same reference characters in the accompanying drawings of the present application.

<<Surface-Coated Boron Nitride Sintered Body Tool>>

In a coated cBN tool of the present embodiment, at least a cutting edge portion includes a cBN sintered body and a coating film formed on the surface of the cBN sintered body. As described later, the coating film has a structure formed by stacking an A layer including columnar crystals that are relatively large in particle size and a B layer including columnar crystals that are relatively small in particle size, thereby achieving an excellent effect that high dimensional precision can be maintained for a long time when processing a sintered alloy, hard-to-cut cast iron, hardened steel and the like, that is, the surface roughness life is relatively long. Also, particularly for wet cutting using a cutting fluid, the coated cBN tool of the present embodiment can exhibit a remarkably long surface roughness life as compared with the conventional cutting tool.

It is considered that boundary wear during wet cutting progresses as in the following manner. (a) Since a cutting fluid (which is also referred to as a coolant) discontinuously comes into contact with an insert during processing, a temperature rise due to frictional heat and cooling due to a cutting fluid (a temperature fall) repeatedly occur at the insert. When the insert undergoes such a heat history, cracking is produced on the coating film surface and reaches the cBN sintered body. (b) This cracking and abrasive wear are combined with each other so that boundary wear abruptly progresses.

It is specifically unclear in what mechanism the coated cBN tool of the present embodiment exhibits an excellent surface roughness life in wet cutting. As a reason therefor, the present inventors estimate that the A layer including columnar crystals each having a large particle size suppresses abrasive wear and the B layer including columnar crystals each having a small particle size suppresses occurrence and propagation of cracking. Each of components forming the coated cBN tool of the present embodiment will be hereinafter described.

<cBN Sintered Body>

A cBN sintered body of the present embodiment forms a base member for a coated cBN tool in a cutting edge portion of the tool, includes 30 vol % or more and 80 vol % or less of cBN particles, and further includes a binder phase as the remainder.

In this case, the binder phase includes: at least one compound selected from the group consisting of nitride, carbide, boride, oxide, and solid solutions thereof in group 4 elements, group 5 elements, and group 6 elements in the periodic table; an aluminum compound; and inevitable impurities. The binder phase binds the cBN particles to each other in the sintered body structure. As 30 vol % or more of cBN particles are contained, a decrease in wear resistance of the cBN sintered body as a base member of the tool can be prevented. Furthermore, as 80 vol % or less of cBN particles are contained, the cBN particles that are excellent in strength and toughness serve as a skeletal structure in the sintered body structure, so that the fracture resistance of the cBN sintered body can be ensured.

In the present specification, the volume content of the cBN particles is to be measured by the method described below. Specifically, a cBN sintered body is mirror-polished, and the backscattered electron image of the cBN sintered body structure in an arbitrary region is observed by using an electron microscope at 2000 times magnification. In this case, the cBN particles are observed as a black area while the binder phase is observed as a gray area or a white area. In an observation view image, the cBN particle region and the binder phase region are binarized by image processing to measure the occupancy area of the cBN particle region. Then, the occupancy area is substituted into the following equation, thereby calculating the volume content of the cBN particles.

(Volume content of cBN particles)=(occupancy area of cBN particles)÷(area of cBN sintered body structure in view image)×100.

It is preferable that the volume content of the cBN particles is 50 vol % or more and 65 vol % or less. As the volume content of the cBN particles is 50 vol % or more, the coated cBN tool tends to exhibit an excellent balance between the wear resistance and the fracture resistance.

Furthermore, as the volume content of the cBN particles is 65 vol % or less, the binder phase is to be distributed appropriately, so that the bonding strength of the cBN particles by the binder phase tends to increase.

Furthermore, it is preferable that the cBN particles are shaped to protrude more to the coating film than to the binder phase at the interface between the cBN sintered body and the coating film. Thereby, the adhesiveness between the cBN sintered body and the coating film can be improved. Furthermore, it is preferable that the difference in level between the cBN particles and the binder phase is 0.05 μm or more and 1.0 μm or less. As the difference in level is 0.05 μm or more, an anchor effect can be achieved. Furthermore, as the difference in level is 1.0 μm or less, the cBN particles can be effectively prevented from falling off from the sintered body. In this case, the difference in level is more preferably 0.1 μm or more and 0.5 μm or less. If the difference in level falls within this range, the anchor effect and the fall-off preventing effect described above can be further improved. In the present specification, the difference in level is to be measured by the same method as the method of measuring the thickness and the like of the entire coating film, which will be described later.

Furthermore, it is preferable that the cBN particles in the cBN sintered body are increased in volume content from the interface between the cBN sintered body and the coating film toward the inside of the cBN sintered body. By such a configuration, the volume content of the binder phase is higher at the interface between the cBN sintered body and the coating film than that of the cBN particles, so that the adhesiveness between the cBN sintered body and the coating film can be improved. In contrast, on the inside of the cBN sintered body, the volume content of the cBN particles is higher than that of the binder phase, so that the fracture resistance of the cBN sintered body can be improved. For example, the volume content of the cBN particles can be set at 40 vol % in an area close to the interface with the coating film (that is, in the region located at a distance of 0 μm or more and 20 μm or less from the interface between the cBN sintered body and the coating film toward the cBN sintered body-side), and can be set at 60 vol % near the center of the cBN sintered body in the thickness direction (that is, in the region located at a distance of more than 20 μm and 100 μm or less from the interface between the cBN sintered body and the coating film toward the inside of the cBN sintered body).

Furthermore, it is preferable that the cBN particles are increased in particle size from the interface between the cBN sintered body and the coating film toward the inside of the cBN sintered body. In such a configuration, the particle size of each cBN particle is relatively small at the interface between the cBN sintered body and the coating film, so that the adhesiveness between the cBN sintered body and the coating film can be improved. On the other hand, since the particle size of each cBN particle is relatively large on the inside of the cBN sintered body, the toughness can be improved. For example, the particle size of each cBN particle can be set at 0.1 μm or more and 1 μm or less in the region located at a distance of 0 μm or more and 20 μm or less from the interface between the cBN sintered body and the coating film toward the inside of the cBN sintered body, and can be set at 2 μm or more and 10 μm or less in the region located at a distance of more than 20 μm and 300 μm or less from the interface between the cBN sintered body and the coating film toward the inside of the cBN sintered body.

In the present specification, the particle size of each cBN particle is to be measured by the following method. Specifically, the diameter of the circle circumscribing the cBN particle (that is, a circumscribed circle equivalent diameter) is measured in the backscattered electron image of the cBN sintered body structure obtained when the volume content of the cBN particles is calculated. Then, this diameter is defined as a particle size of the cBN particle.

Furthermore, in the present embodiment, the cBN sintered body only has to be provided in the cutting edge portion of the coated cBN tool. In other words, the base member of the coated cBN tool may include a cutting edge portion formed of a cBN sintered body, and a base member main body made of a material different from that of the cBN sintered body (for example, cemented carbide). In this case, it is preferable that the cutting edge portion formed of a cBN sintered body is bonded to the base member main body with a braze material and the like. The braze material may be selected as appropriate in consideration of the bonding strength and the melting point. In addition, the cBN sintered body may form the entire base member of the coated cBN tool.

<Coating Film>

The coating film of the present embodiment includes an A layer and a B layer. In the present embodiment, the coating film can include any layers other than these A and B layers as long as it includes these A and B layers. Even if the coating film includes other layers, the effect of the present invention can be achieved. In this case, other layers may for example be: a C layer provided between the A layer and the B layer described later; a D layer as the lowermost layer, and the like. It is to be noted that other layers are not limited to those described above and do not deviate from the scope of the present invention even if layers other than those described above are included.

In the present embodiment, the thickness of the entire coating film is 0.3 μm or more and 15 μm or less. As the thickness of the coating film is 0.3 μm or more, it becomes possible to prevent a decrease in wear resistance of the coated cBN tool resulting from a thin coating film. Furthermore, as the thickness of the entire coating film is 15 μm or less, the chipping resistance of the coating film in the early stage of cutting can be improved. The thickness of the entire coating film is more preferably 1.5 μm or more and 15 μm or less.

In the present specification, each thickness of the coating film and each layer described later, and the number of stacked layers were measured by observing a cross section, which was obtained by cutting the coated cBN tool, with a scanning electron microscope (SEM) or a transmission electron microscope (TEM). Furthermore, the composition of each of layers forming a coating film was measured by an energy dispersive X-ray spectroscopy (EDX) attached to the SEM or the TEM. In this case, the sample for cross-section observation can be produced, for example, using a focused ion beam system (FIB), a cross section polisher (CP), and the like.

Also, in the present embodiment, the coating film needs to be provided only in the cutting edge portion of the coated cBN tool, and does not need to be provided in a part of the portion different from the cutting edge portion or may cover the entire surface of the base member of the coated cBN tool. Also, the stacking configuration in a part of the coating film may be partially different in a portion different from the cutting edge.

<A Layer>

In the present embodiment, the A layer is formed of columnar crystals and includes $MLa_{za1}$ (M represents one or more of group 4 elements, group 5 elements and group 6 elements in the periodic table, Al and Si; La represents one or more of B, C, N, and O; and za1 is 0.85 or more and 1.0 or less). The columnar crystals each have a particle size Wa of 10 nm or more and 400 nm or less. As the A layer is formed of columnar crystals each having a specific composition and a relatively large particle size in this way, abrasive wear can be suppressed effectively in wet cutting.

It can be confirmed that the A layer (or the B layer described later) is formed of columnar crystals by observing, with a TEM, a cross section of the coated cBN tool obtained by cutting this coated cBN tool. Specifically, the cross section of the coating film is observed by the TEM to determine based on the crystal grain aspect ratio (the ratio between the crystal grain major axis and the crystal grain minor axis (major axis÷minor axis)) whether each layer is formed of columnar crystals or not. In the present specification, a crystal having an aspect ratio of 1.5 or more is defined as a "columnar crystal" while a crystal having an aspect ratio of less than 1.5 is defined as a "granular crystal". In addition, the expression that "a layer is formed of columnar crystals" means that the crystal structure of the layer mainly includes columnar crystals, but does not necessarily mean that all crystal grains are uniformly columnar crystals. Therefore, this layer may partially include granular crystals.

Furthermore, the "particle size of each of the columnar crystals" used in the present specification indicates a minor axis (diameter) of a columnar crystal. The "particle size of each of the columnar crystals" is to be measured as in the following manner. First, a coated cBN tool is cut, and the cross section of the layer as a target to be measured is observed at 20000 times to 1 million times magnification using a TEM. In this case, it is preferable to adjust the magnification such that at least 20 crystal grains (columnar crystals) are included in an observation view. Then, for 10 columnar crystals selected at random in the observation view, the maximum width (the maximum diameter) of the width (minor axis) perpendicular to the columnar-crystal extending direction is measured. Then, the arithmetic mean value of the measured values excluding the maximum value and the minimum value from the measured values obtained as described above is defined as a "particle size of each of the columnar crystals".

In addition, most of the columnar crystals in the present embodiment each have a crystal orientation extending approximately in the perpendicular direction (that is, the thickness direction of the coating film) relative to the surface of the cBN sintered body (base member). However, in the above-described cross section, the columnar crystals are not necessarily oriented in a fixed direction, but may be randomly oriented. Furthermore, the orientation relationship between the columnar-crystal extending direction and the cutting plane is not necessarily fixed. However, since the crystal orientation and the like are properly averaged by employing the above-described measuring method, the calculated "particle size" can be treated as a representative value of the crystal structure as a target to be measured.

In this case, particle size Wa of each of the columnar crystals included in the A layer is more preferably 50 nm or more and 300 nm or less, and further preferably 150 nm or more and 250 nm or less. As particle size Wa falls within this range, abrasive wear can be much more effectively suppressed.

It is more preferable that the above-described A layer includes $(Ti_{1-xa}Ma_{xa})(C_{1-za2}N_{za2})$ (Ma represents one or more of group 4 elements except for Ti, group 5 elements and group 6 elements in the periodic table, Al and Si; xa is 0 or more and 0.7 or less; and za2 is 0 or more and 1 or less). In this way, as the A layer contains Ti, the layer smoothly wears out during cutting processing. In other words, the A layer can wear out without undergoing peeling, cracking or chipping. Therefore, the coated cBN tool can be improved in crater wear resistance, flank face wear resistance or the like. In this case, it is more preferable that the above-mentioned xa is 0 or more and 0.3 or less. As xa falls within this range, the above-described effect can be further more improved. In the case where the A layer includes $(Ti_{1-xa(1)-xa(2)}Ma(1)_{xa(1)}Ma(2)_{xa(2)})(C_{1-za2}N_{za2})$, the sum of xa(1) and xa(2) is preferably 0 or more and 0.7 or less, and more preferably 0 or more and 0.3 or less. This also similarly applies to the B layer, the C layer and the D layer which will be described later.

According to the present embodiment, in the A layer, it is preferable that the composition (za2) of N described above changes in a step-like manner or in a slope-like manner from the cBN sintered body-side toward the surface-side of the A layer. For example, in the case where the composition of N is relatively large on the cBN sintered body-side of the A layer, the fracture resistance and the peeling resistance tends to increase. Furthermore, for example, in the case where the composition of N is relatively small on the surface-side of the A layer, peeling, cracking, chipping or the like of the A layer during wearing can be prevented. In this case, the expression that "the composition of N changes in a step-like manner from the cBN sintered body-side toward the surface-side of the A layer" means that the composition of N discontinuously decreases or increases from the cBN sintered body-side toward the surface-side of the A layer, for example, which is a configuration in which the composition of N is obtained by stacking two or more different layers. Furthermore, the expression that "the composition of N changes in a slope-like manner from the cBN sintered body-side toward the surface-side of the A layer" means that the composition of N continuously decreases or increases from the cBN sintered body-side toward the surface-side of the A layer, for example, which is a configuration obtained by continuously changing the flow rate ratio between raw material gas of N and raw material gas of C when the A layer is formed by the arc ion plating method.

Furthermore, it is preferable that the A layer is provided on its surface-side with a region where the composition of C is larger than that on its cBN sintered body-side. Thereby, the fracture resistance and the peeling resistance increase on the cBN sintered body-side of the A layer while peeling, cracking, chipping or the like of the A layer during wearing can be effectively prevented on the surface-side of the A layer. In this case, the cBN sintered body-side of the A layer means a region located at a distance of 0 µm or more and 0.1 µm or less from the surface of the A layer located closest to the cBN sintered body toward the inside of the A layer. Furthermore, the surface-side of the A layer shows a portion of the A layer that is different from its cBN sintered body-side.

The thickness of the A layer in the present embodiment is 0.2 µm or more and 10 µm or less. As the thickness of the A layer is 0.2 µm or more, the crater wear resistance, the flank face wear resistance or the like of the coated cBN tool tends to increase. If the thickness of the A layer exceeds 10 µm, it may be difficult to improve the crater wear resistance, the flank face wear resistance or the like. Therefore, the thickness of the A layer needs to be 10 µm or less. The thickness of the A layer is more preferably 1 µm or more and 3 µm or less.

Furthermore, in the present embodiment, it is preferable that the A layer is provided closer to the surface-side of the coated cBN tool than the B layer described later. Thereby, the A layer smoothly wears out so that occurrence of cracking can be suppressed. Furthermore, even if cracking occurs, the B layer can prevent this cracking from spreading to the base member-side.

<B Layer>

In the present embodiment, the B layer is formed of columnar crystals and formed by alternately stacking one or more of each of two or more compound layers having different compositions. Such a B layer can for example be a layer formed by alternately stacking two or more compound layers each including columnar crystals. In such a case, between adjoining compound layers, columnar crystals included in one compound layer and columnar crystals included in another compound layer may be integrally formed in such a state where these columnar crystals cannot be distinguished as different crystal grains separately from each other. In other words, the B layer may also be formed of columnar crystals including two or more compound layers.

The following shows a configuration obtained by alternately stacking one or more of each of a B1 compound layer and a B2 compound layer. As long as the B layer in the present embodiment includes a B1 compound layer and a B2 compound layer, the effects of the present invention can be achieved even if this B layer includes layers other than the B1 compound layer and the B2 compound layer. Furthermore, the thickness of the B layer is 0.05 µm or more and 5 µm or less.

<B1 Compound Layer>

The B1 compound layer forming a B layer includes $(Ti_{1-xb1-yb1}Si_{xb1}M1_{yb1})(C_{1-zb1}N_{zb1})$ (M1 represents one or more of group 4 elements except for Ti, group 5 elements and group 6 elements in the periodic table, and Al; xb1 is 0.01 or more and 0.25 or less; yb1 is 0 or more and 0.7 or less; and zb1 is 0.4 or more and 1 or less). In this case, the thickness of the B1 compound layer is 0.5 nm or more and 300 nm or less.

<B2 Compound Layer>

The B2 compound layer forming a B layer together with the B1 compound layer includes $(Al_{1-xb2}M2_{xb2})(C_{1-zb2}N_{zb2})$ (M2 represents one or more of group 4 elements, group 5 elements and group 6 elements in the periodic table, and Si; xb2 is 0.2 or more and 0.7 or less; and zb2 is 0.4 or more and 1 or less). In this case, it is preferable that M2 represents at least one of Ti and Cr. As the B2 compound layer includes Al and at least one of Ti and Cr, the B2 compound layer can be provided with a function as a layer with high toughness, which has both of wear resistance and heat resistance.

Furthermore, a composition xb2 of M2 is preferably 0.25 or more and 0.5 or less, and more preferably 0.25 or more and 0.4 or less. Furthermore, the thickness of the B2 compound layer is 0.5 nm or more and 300 nm or less.

In this case, the thickness of each layer included in the B layer can be less than 30 nm. As the B1 compound layer or the B2 compound layer having the composition described above entirely or partially has a thickness of less than 30 nm, strength and toughness can be improved in this portion, so that progress of cracking can be suppressed.

In the present embodiment, it is preferable that the ratio between an average thickness t1 of the B1 compound layers and an average thickness t2 of the B2 compound layers is defined as t2/t1, which satisfies the relation of $0.5 < t2/t1 \le 10.0$. In the present specification, average thickness t1 of the B1 compound layers is calculated using the following calculation formula (the same applies to average thickness t2 of the B2 compound layers).

(Average thickness $t1$ of $B$ compound layers)=(total thickness of $B1$ compound layers)÷(the number of $B1$ compound layers).

Furthermore, in the case where it is difficult to measure the thickness of the B1 compound layer, average thickness t1 of the B1 compound layers can be calculated using the following calculation formula (the same also applies to average thickness t2 of the B2 compound layers).

(Average thickness $t1$ of $B1$ compound layers)= (thickness of $B$ layer formed by stacking only $B1$ compound layers)÷(the number of stacked $B1$ compound layers).

As the above-mentioned t2/t1 satisfies the relation of $0.5 < t2/t1 \le 10.0$, the boundary wear resistance and the like in the coated cBN tool are remarkably improved. Therefore, even under the severe operating conditions that impacts and vibrations are repeatedly applied, for example, as in the case of interrupted cutting, a sufficient surface roughness life can be provided. In this case, t2/t1 more preferably satisfies the relation of $1.6 < t2/t1 \le 5.0$, and further preferably satisfies the relation of $3.0 < t2/t1 \le 4.0$.

In the present embodiment, particle size Wb of each of the columnar crystals included in the B layer (that is, the B1 compound layer and the B2 compound layer) is 5 nm or more and 70 nm or less. In this way, as the B layer is formed of columnar crystals each having a relatively small particle size, occurrence and progress of cracking due to thermal shock can be effectively suppressed. In this case, particle size Wb is more preferably 7 nm or more and 40 nm or less, and further preferably 15 nm or more and 30 nm or less. As particle size Wb falls within this range, occurrence and progress of cracking can be much more effectively suppressed.

Furthermore, in the present embodiment, it is preferable that particle size Wa of each of the columnar crystals included in the A layer and particle size Wb of each of the columnar crystals included in the B layer satisfy the relation of $1 < Wa/Wb \le 30$. As the ratio of the particle sizes satisfies such a specific relation, the effect of suppressing progress of cracking can be further improved. In this case, from the viewpoint that the above-described effect can readily be achieved, the relation between Wa and Wb is more preferably $1 < Wa/Wb < 10$, and particularly preferably $1 < Wa/Wb < 4$.

In addition, the lowermost layer of the B layer may be a B1 compound layer or a B2 compound layer. Furthermore, the uppermost layer of the B layer may be a B1 compound layer or a B2 compound layer.

<C Layer>

It is preferable that the coating film of the present embodiment further includes a C layer provided between the A layer and the B layer. It is preferable that this C layer includes $McLc_{zC}$ (Mc represents one or more of group 4 elements, group 5 elements and group 6 elements in the periodic table, Al and Si; Lc represents one or more of B, C, N, and O; and zc is 0 or more and 0.85 or less). By providing the C layer, the A layer and the B layer that are different in characteristics and structure can be firmly adhered to each other. Furthermore, when the A layer is provided closer to the surface-side than the B layer, damage resulting from wear of the A layer and cracking occurring in the A layer can be blocked by the C layer from spreading to the base member-side.

Furthermore, it is preferable that the thickness of the C layer is 0.005 µM or more and 0.5 µM or less. As the thickness of the C layer is 0.005 or more, the adhesiveness between the A layer and the B layer can be improved. Furthermore, as the thickness of the C layer is 0.5 µm or less, the thickness of the coating film can be prevented from being excessively increased by the C layer. In this case, the thickness of the C layer is more preferably 0.01 µm or more and 0.2 µm or less.

In the above-described McLc$_{zc}$, it is preferable that a composition zc of Lc is more than 0 and less than 0.7. As zc is more than 0, the heat resistance and the chemical wear resistance of the C layer can be improved, and cracking occurring in the A layer can be blocked from spreading toward the base member-side. In addition, zc is more preferably 0.2 or more and 0.5 or less.

Furthermore, it is preferable that the C layer includes at least one or more of elements forming the A layer and the B layer. As the C layer includes the same element as that included in the A layer in this way, the adhesiveness between the C layer and the A layer can be improved. Furthermore, as the C layer includes the same element as that included in the B layer, the adhesiveness between the C layer and the B layer can be improved. Also, it is suitable that the C layer includes at least one or more of elements forming a portion in each of the A layer and the B layer that is located on the C layer-side because the adhesiveness tends to be further improved.

Furthermore, the C layer is formed of granular crystals including the above-described McLc$_{zc}$, and particle size Wc of each of the granular crystals is preferably 5 nm or more and 300 nm or less, and more preferably satisfies the relation of Wb<Wc<Wa. In this way, the crystal structure of the C layer is formed of granular crystals, and the particle size thereof represents a value intermediate between the particle size in the A layer and the particle size in the B layer. Consequently, the adhesiveness between the A layer and the B layer tends to increase while propagation of cracking tends to be readily suppressed. In addition, particle size Wc is more preferably 10 nm or more and 200 nm or less, and further preferably 50 nm or more and 120 nm or less. As particle size Wc falls within this range, the adhesiveness between the A layer and the B layer can be further improved.

In this case, it can be confirmed that the C layer is formed of granular crystals by observing, with the TEM, a cross section of the coated cBN tool obtained by cutting this coated cBN tool. As described above, the crystal grain having an aspect ratio of less than 1.5 measured when observing the cross section of the coating film by the TEM is a "granular crystal". In addition, the expression that "a layer is formed of granular crystals" means that the crystal structure of the layer mainly includes granular crystals, but does not necessarily mean that all crystal grains are uniformly granular crystals. Therefore, the layer may partially include columnar crystals.

Furthermore, in the present specification, "the particle size of each of the granular crystals" is to be measured in the following manner. First, the coated cBN tool is cut, and a cross section of the layer as a target to be measured is observed using a TEM at 20000 times to 1 million times magnification. In this case, it is preferable to adjust the magnification such that at least 20 crystal grains (granular crystals) are included in an observation view. Then, a circumscribed circle equivalent diameter for each of 10 granular crystals selected at random in the observation view is measured. Then, the arithmetic mean value of the measured values excluding the maximum value and the minimum value from the measured values obtained as described above is defined as a "particle size of each of the granular crystals".

<D Layer>

It is preferable that the coating film of the present embodiment further includes a D layer provided between the base member and the B layer. It is preferable that this D layer includes MdLd$_{zd}$ (Md represents one or more of group 4 elements, group 5 elements and group 6 elements in the periodic table, Al and Si; Ld represents one or more of B, C, N, and O; and zd is 0.85 or more and 1.0 or less). Such a D layer is excellent in adhesiveness with the cBN sintered body. Therefore, the coating film including the D layer can improve the adhesiveness between the coating film and the cBN sintered body. In addition, Ld is more preferably N.

In this case, it is more preferable that the D layer includes (Al$_{1xd}$Md2$_{xd}$) Ld$_{zd}$ (Md2 represents one or more of group 4 elements, group 5 elements and group 6 elements in the periodic table, and Si; and xd is 0.25 or more and 0.45 or less). In this way, it is suitable that the D layer contains Al since the adhesiveness between the coating film and the cBN sintered body tends to be further increased. In addition, Md2 is more preferably at least one or more of Ti, Cr, and V.

Furthermore, it is preferable that the thickness of the D layer is 0.05 µm or more and 1 µm or less. As the thickness of the D layer is 0.05 µm or more, the adhesiveness between the coating film and the cBN sintered body can be improved. Also, as the thickness of the D layer is 1 µm or less, the thickness of the coating film can be prevented from being excessively increased by the D layer. In this case, the thickness of the D layer is more preferably 0.1 µm or more and 0.5 µm or less.

<<Method of Manufacturing Coated cBN Tool>>

A method of manufacturing a coated cBN tool according to the present embodiment includes for example the steps of: preparing a base member in which at least a cutting edge portion includes a cBN sintered body; and forming a coating film on the cBN sintered body.

<Step of Preparing Base Member>

The base member of the present embodiment can be manufactured by bonding a base member main body and a base member formed of a cBN sintered body. The base member main body can be made using a material, for example, cemented carbide. Such a base member main body can be manufactured, for example, by the conventionally known sintering method and molding method. Furthermore, the base member formed of a cBN sintered body can be manufactured, for example, by sintering a mixture made of cBN particles and raw material powder of a binder phase under high-temperature and high-pressure conditions. Then, the base member formed of a cBN sintered body is bonded with the conventionally known braze material to an appropriate portion of the base member main body, which is then subjected to grinding processing and formed into a prescribed shape, with the result that the base member can be manufactured. In addition, it is a matter of course that the entire base member is formed of a cBN sintered body.

<Step of Forming Coating Film>

A coating film is formed on the base member obtained as described above, so that a coated cBN tool can be manufactured. In this case, it is preferable that the step of forming an coating film includes the step of forming a coating film by the arc ion plating method (the ion plating method for evaporating a solid material by utilizing vacuum arc discharge) or by the sputtering method. According to the arc ion plating method, a coating film can be formed using: a metal evaporation source containing metal species for forming a coating film; and reaction gas such as $CH_4$, $N_2$ or $O_2$. In addition, the conditions for forming a coating film can be conventionally known conditions. According to the sputtering method, a coating film can be formed using: a metal evaporation source containing metal species for forming a coating film; reaction gas such as $CH_4$, $N_2$, or $O_2$; and sputtering gas such as Ar, Kr, and Xe. Also in this case, the conditions for forming a coating film can be conventionally known conditions.

EXAMPLES

Although the present invention will be hereinafter described in greater detail with reference to Examples, the present invention is not limited thereto.

<<Manufacture of Coated cBN Tool>>

FIG. 1 is a cross-sectional view showing an example of the configuration of a coated cBN tool in Example. FIG. 2 is a cross-sectional view showing an example of the configuration of a main part of the coated cBN tool in Example.

<Manufacture of cBN Sintered Body>

As described below, cBN sintered bodies A to I each having a composition shown in Table 1 were manufactured. Each compound shown in the column of "X-ray Detecting Compound" in Table 1 is a compound detected when qualitatively analyzing the cross section or the surface of the cBN sintered body by an X-ray diffraction (XRD) apparatus.

(Manufacture of cBN Sintered Body A)

First, a mixture was obtained by mixing TiN powder having an average particle size of 1 μm and Ti powder having an average particle size of 3 m in an atomic ratio of Ti:N=1:0.6. This mixture was heat-treated for 30 minutes at 1200° C. in a vacuum and then ground. Thereby, intermetallic compound powder made of $TiN_{0.6}$ was obtained.

Then, a mixture was obtained by mixing intermetallic compound powder made of $TiN_{0.6}$ and Al powder having an average particle size of 4 μm in a mass ratio of $TiN_{0.6}$:Al=90:10. This mixture was heat-treated for 30 minutes at 1000° C. in a vacuum. The compound obtained by the heat treatment was uniformly ground by the ball-milling method using ball media made of cemented carbide and having a diameter of 6 mm. Thereby, raw material powder of the binder phase was obtained.

Then, cBN particles having an average particle size of 1.5 μm and raw material powder of the binder phase were blended so as to achieve 30 vol % of the content of the cBN particles in the cBN sintered body, and then, uniformly mixed by the ball mill mixing method using ball media made of boron nitride and having a diameter of 3 mm, thereby obtaining powdery mixture. Then, this mixture was stacked on a support substrate made of cemented carbide, and then introduced into a capsule made of Mo, which was then sintered for 30 minutes at pressure of 5.5 GPa and at a temperature of 1300° C. using an ultra-high pressure apparatus. Thereby, a cBN sintered body A was obtained.

(Manufacture of cBN Sintered Bodies B to G)

As shown in Table 1, cBN sintered bodies B to G were obtained in the same manner as with cBN sintered body A, except that cBN particles having different volume contents and different average particle sizes were used.

(Manufacture of cBN Sintered Body H)

First, a mixture was obtained by mixing TiCN powder having an average particle size of 1 μm and Ti powder having an average particle size of 3 μm in an atomic ratio of Ti:C:N=1:0.3:0.3. Then, this mixture was heat-treated for 30 minutes at 1200° C. in a vacuum and then ground. Thereby, intermetallic compound powder made of $TiC_{0.3}N_{0.3}$ was obtained.

Then, a mixture was obtained by mixing intermetallic compound powder made of $TiC_{0.3}N_{0.3}$ and Al powder having an average particle size of 4 μm in a mass ratio of $TiC_{0.3}N_{0.3}$:Al=90:10. This mixture was heat-treated for 30 minutes at 1000° C. in a vacuum. The compound obtained by the heat treatment was uniformly ground by the ball-milling method using ball media made of cemented carbide and having a diameter of 6 mm. Thereby, raw material powder of the binder phase was obtained. Then, the raw material powder of the binder phase was used to obtain a cBN sintered body H in the same manner as with cBN sintered body A, except that cBN particles having different volume contents and different average particle sizes were used, as shown in Table 1.

(Manufacture of cBN Sintered Body I)

First, a mixture was obtained by mixing TiC powder having an average particle size of 1 μm and Ti powder having an average particle size of 3 μm in an atomic ratio of Ti:C=1:0.6. This mixture was heat-treated for 30 minutes at 1200° C. in a vacuum and then ground. Thereby, intermetallic compound powder made of $TiC_{0.6}$ was obtained.

Then, a mixture was obtained by mixing intermetallic compound powder made of $TiC_{0.6}$ and Al powder having an average particle size of 4 μm in a mass ratio of $TiC_{0.6}$:Al=90:10. This mixture was heat-treated for 30 minutes at 1000° C. in a vacuum. The compound obtained by the heat treatment was uniformly ground by the ball-milling method using ball media made of cemented carbide and having a diameter of 6 mm. Thereby, raw material powder of the binder phase was obtained. Then, the raw material powder of the binder phase was used to obtain a cBN sintered body I in the same manner as with cBN sintered body A, except that cBN particles having different volume contents and different average particle sizes were used, as shown in Table 1.

TABLE 1

| cBN Sintered Body | cBN Particles Volume Content (Vol %) | Average Particle Size (μm) | Raw Material Powder of Binder Phase | X-ray Detecting Compound |
|---|---|---|---|---|
| A | 30 | 1.5 | $TiN_{0.6}$, Al | cBN, TiN, $TiB_2(AlB_2)$ |
| B | 80 | 1.5 | $TiN_{0.6}$, Al | cBN, TiN, $TiB_2(AlB_2)$ |
| C | 50 | 1.5 | $TiN_{0.6}$, Al | cBN, TiN, $TiB_2(AlB_2)$ |
| D | 58 | 1.5 | $TiN_{0.6}$, Al | cBN, TiN, $TiB_2(AlB_2)$ |
| E | 65 | 1.5 | $TiN_{0.6}$, Al | cBN, TiN, $TiB_2(AlB_2)$ |
| F | 58 | 0.5 | $TiN_{0.6}$, Al | cBN, TiN, $TiB_2(AlB_2)$ |
| G | 58 | 3 | $TiN_{0.6}$, Al | cBN, TiN, $TiB_2(AlB_2)$ |
| H | 58 | 1.5 | $TiC_{0.3}N_{0.3}$, Al | cBN, TiCN, $TiB_2(AlB_2)$ |
| I | 58 | 1.5 | $TiC_{0.6}$, Al | cBN, TiC, $TiB_2(AlB_2)$ |

<Manufacture of Sample 1>

A coated cBN tool according to Sample 1 was manufactured as described below.

<Formation of Base Member>

A base member main body having a shape of DNGA150408 of the ISO standard and made of a cemented carbide material (equivalent to K10) was prepared. The above-described cBN sintered body A (shape: a 2-mm-thick triangular prism having isosceles triangles as bases whose vertex angle was 55° and sides sandwiching the vertex angle were each 2 mm) was bonded to an insert (corner portion) of this base member main body. A braze material made of Ti—Zr—Cu was used for bonding. Then, the outer circumferential surface, the upper surface and the lower surface of the bonded body were ground to form a negative land shape (a negative land width of 150 μm and a negative land angle of 25°) at the insert. In this way, a base member 3 having a cutting edge portion formed of cBN sintered body A (see FIG. 1) was obtained.

<Formation of Coating Film>

(Film Forming Apparatus)

A film forming apparatus used for forming a coating film will be hereinafter described in the subsequent steps. A vacuum pump is connected to the film forming apparatus, within which a vacuum chamber that can be evacuated is provided. A rotary table is placed inside the vacuum chamber. This rotary table is configured such that the base member can be placed thereon through a jig. The base member placed within the vacuum chamber can be heated by a heater placed inside the vacuum chamber. Also, a gas pipe for introducing gas for etching and film forming is connected to the vacuum chamber through a mass flow controller (MFC) for flow rate control. Furthermore, a tungsten filament for generating Ar ions for etching, or an arc evaporation source or a sputtering source for film formation to which a necessary power supply is connected is disposed within the vacuum chamber. Then, evaporation source raw material (target) required for film formation is placed in the arc evaporation source or the sputtering source.

(Etching of Base Member)

Base member 3 obtained as described above was placed within the vacuum chamber of the film forming apparatus, and the chamber was evacuated. Then, base member 3 was heated to 500° C. while rotating the rotary table at 3 rpm. Then, Ar gas was introduced into the vacuum chamber, a tungsten filament was discharged to generate Ar ions, a bias voltage was applied to base member 3, and base member 3 was etched by Ar ions. The etching conditions in this case are as described below.

Pressure of Ar gas: 1 Pa
Substrate bias voltage: −500V.

(Formation of D Layer)

Then, a D layer 20 was formed on base member 3 within the above-described film forming apparatus. Specifically, the D layer was formed while adjusting the vapor deposition time so as to achieve a thickness of 0.1 μm under the conditions described below.

Target: Al (70 atom %), Ti (30 atom %)
Introduced gas: $N_2$
Film forming pressure: 3 Pa
Arc discharge current: 120 A
Substrate bias voltage: −50V
Table rotation speed: 3 rpm.

(Formation of B Layer)

Subsequently to D layer 20, a B layer 30 was formed on D layer 20 within the film forming apparatus described above. Specifically, B1 compound layer 31 and B2 compound layer 32 were alternately formed each for 100 times repeatedly under the conditions described below, so that a B layer 30 formed of 200 layers in total and having a thickness of 1.0 μm was formed (see FIG. 2). When forming the B layer, the arc vapor deposition source of the B1 compound layer and the arc vapor deposition source of the B2 compound layer were simultaneously ignited, and the table rotation speed of the rotary table was adjusted, thereby achieving a B1 compound layer 31 having a thickness of 4 nm and a B2 compound layer 32 having a thickness of 6 nm. In Sample 1, the lowermost layer of the B layer is B1 compound layer 31 while the uppermost layer thereof is B2 compound layer 32.

(Formation of B1 Compound Layer)

The B1 compound layer was formed under the conditions described below.

Target: Ti (80 atom %), Si (20 atom %)
Introduced gas: $N_2$
Film forming pressure: 3 Pa
Arc discharge current: 120 A
Substrate bias voltage: −50V.

(Formation of B2 Compound Layer)

The B2 compound layer was formed under the conditions described below.

Target: Al (70 atom %), Ti (30 atom %)
Introduced gas: $N_2$
Film forming pressure: 3 Pa
Arc discharge current: 160 A
Substrate bias voltage: −50V.

(Formation of A Layer)

After forming B layer 30, an A layer 50 was formed on B layer 30 under the conditions described below. In this case, the flow rate of the introduced gas ($N_2$ and $CH_4$) was adjusted so as to be set at C:N=3:7 in A layer 50. Then, the vapor deposition time was adjusted, thereby forming an A layer having a thickness of 0.1 μm.

Target: Ti
Introduced gas: $N_2$, $CH_4$
Film forming pressure: 2 Pa
Arc discharge current: 130 A
Substrate bias voltage: −450V
Table rotation speed: 3 rpm.

As described above, a coated cBN tool according to Sample 1 including coating film 10 obtained by stacking D layer 20, B layer 30 and A layer 50 in this order on base member 3 was obtained.

<Manufacture of Samples 2 to 6>

Coated cBN tools according to Samples 2 to 6 were obtained in the same manner as with Sample 1, except for changing the thickness of the A layer for each Sample as shown in Table 2 by adjusting the vapor deposition time.

<Manufacture of Samples 7 to 52>

As shown in Tables 2 and 3, coated cBN tools according to Samples 7 to 52 were manufactured using cBN sintered bodies A to I. In Tables 2 and 3, each Sample marked with a symbol "*" in the left-side column represents a coated cBN tool according to each Example.

For each of these Samples, a coating film was formed while appropriately making an adjustment within a range of the film forming conditions described below so as to achieve each layer shown in Tables 2 and 3.

(Film Forming Conditions)

Target: metallic element shown in the composition column of each layer in Tables 2 and 3
Introduced gas: appropriately select one or more from Ar, $N_2$, and $CH_4$
Film forming pressure: 0.1 Pa to 7 Pa
Arc discharge current: 60 A to 300 A
Substrate bias voltage: −700V to −25V
Table rotation speed: 2 rpm to 10 rpm.

TABLE 2

| Coated cBN Tool | cBN Sintered Body | A Layer MLa$_{za1}$ Composition | Thickness (μm) | Crystal Structure | Particle Size Wa (nm) | C Layer McLc$_{zc}$ Composition | Thickness (μm) | C Layer McLc$_{zc}$ Crystal Structure | Particle Size Wc (nm) | B Layer | Particle Size Ratio Wa/Wb | D Layer MdLd$_{zd}$ Composition | Thickness (μm) | Thickness of Entire Coating Film (μm) |
|---|---|---|---|---|---|---|---|---|---|---|---|---|---|---|
| Sample 1 | A | TiC$_{0.3}$N$_{0.7}$ | 0.1 | columnar crystal | 50 | None | — | — | — | Shown in Table 3 | 28.6 | Al$_{0.7}$Ti$_{0.3}$N | 0.1 | 1.2 |
| * 2 | | | 0.5 | | 200 | | | | | | | | | 1.6 |
| * 3 | | | 1.5 | | 350 | | | | | | | | | 2.6 |
| * 4 | | | 5 | | | | | | | | | | | 6.1 |
| * 5 | | | 8 | | | | | | | | | | | 9.1 |
| 6 | | | 11 | | | | | | | | | | | 12.1 |
| 7 | D | Ti$_{0.9}$Si$_{0.1}$CN* | 1.7 | columnar crystal | 5 | None | — | — | — | | 0.3 | Al$_{0.67}$Cr$_{0.33}$N | 0.2 | 2.9 |
| * 8 | | Ti$_{0.95}$Si$_{0.05}$CN* | | | 20 | | | | | | 1.0 | | | |
| * 9 | | Ti$_{0.99}$Si$_{0.01}$CN* | | | 100 | | | | | | 5.0 | | | |
| * 10 | | TiCN*[1] | | | 180 | | | | | | 9.0 | | | |
| * 11 | | | | | 250 | | | | | | 12.5 | | | |
| * 12 | | | | | 350 | | | | | | 17.5 | | | |
| 13 | | | | | 500 | | | | | | 25.0 | | | |
| 14 | B | Ti$_{0.5}$Al$_{0.5}$N | 3.0 | columnar crystal | 120 | TiN$_{0.5}$ | 0.02 | granular crystal | 50 | | 0.8 | Al$_{0.6}$Cr$_{0.4}$N | 0.5 | 4.6 |
| * 15 | | | | | | | | | | | 2.4 | | | |
| * 16 | | | | | | | | | | | 4.8 | | | |
| * 17 | | | | | | | | | | | 6.0 | | | |
| * 18 | | | | | | | | | | | 8.0 | | | |
| * 19 | | | | | | | | | | | 20.0 | | | |
| 20 | | | | | | | | | | | 60.0 | | | |
| 21 | C | Ti$_{0.85}$W$_{0.15}$N | 1.0 | columnar crystal | 80 | None | — | — | — | | 26.7 | Al$_{0.75}$Cr$_{0.2}$V$_{0.05}$N | 0.2 | 2.2 |
| 22 | | | | | | | | | | | 11.4 | | | 2.2 |
| 23 | | | | | | | | | | | 5.3 | | | 2.2 |
| 24 | | | | | | | | | | | 2.7 | | | 2.3 |
| 25 | | | | | | | | | | | 1.3 | | | 2.2 |
| 26 | | | | | | | | | | | 0.8 | | | 2.2 |

TABLE 2-continued

| | | A Layer MLa$_{za1}$ | | | | C Layer McLc$_{zc}$ | |
|---|---|---|---|---|---|---|---|
| Coated cBN Tool | cBN Sintered Body | Composition | Thickness (μm) | Crystal Structure | Particle Size Wa (nm) | Composition | Thickness (μm) |
| Sample 27 | E | TiCN*[2] | 1.5 | columnar crystal | 150 | None | — |
| * 28 | | | | | | | |
| * 29 | | | | | | | |
| * 30 | | | | | | | |
| 31 | | | | | | | |
| 32 | F | Ti$_{0.75}$Al$_{0.25}$N | 2.0 | columnar crystal | 230 | TiAl | 0.2 |
| * 33 | | | | | | | |
| * 34 | | | | | | | |
| * 35 | | | | | | | |
| * 36 | | | | | | | |
| 37 | | | | | | | |
| 38 | G | Ti$_{0.5}$Al$_{0.4}$Si$_{0.1}$N | 5 | columnar crystal | 60 | None | 0 |
| * 39 | | | | | | | |
| * 40 | | | | | | | |
| * 41 | | | | | | | |
| * 42 | | | | | | | |
| 43 | | | | | | | |
| 44 | H | TiC$_{0.1}$N$_{0.9}$ | 0.1 | columnar crystal | 50 | None | — |
| * 45 | | | 1 | | 290 | | |
| * 46 | | TiCN*[3] | 2 | | | | |
| * 47 | | | 4 | | | | |
| * 48 | | | 8 | | | | |
| 49 | | | 12 | | | | |
| 50 | D | TiAlN | 3 | columnar crystal | 350 | None | — |
| 51 | | None | — | — | — | None | — |
| 52 | | Ti$_{0.7}$Si$_{0.3}$N | 0.8 | granular crystal | 5 | None | — |

| | C Layer McLc$_{zc}$ | | | D Layer MdLd$_{zd}$ | | Thickness of Entire |
|---|---|---|---|---|---|---|
| Coated cBN Tool | Crystal Structure | Particle Size Wc (nm) | B Layer | Particle Size Ratio Wa/Wb | Composition | Thickness (μm) | Coating Film (μm) |
| Sample 27 | — | — | Shown in Table 3 | 5.0 | Al$_{0.7}$Ti$_{0.1}$Cr$_{0.2}$N | 0.1 | 3.2 |
| * 28 | | | | | | | |
| * 29 | | | | | | | |
| * 30 | | | | | | | |
| 31 | | | | | | | |
| 32 | granular crystal | 120 | | 76.7 | Al$_{0.78}$V$_{0.22}$N | 0.01 | 3.0 |
| * 33 | | | | 23.0 | | | 3.0 |
| * 34 | | | | 12.8 | | | 3.0 |
| * 35 | | | | 9.2 | | | 3.0 |
| * 36 | | | | 6.6 | | | 3.2 |
| 37 | | | | 4.6 | | | 2.9 |
| 38 | — | — | | 6.0 | Al$_{0.7}$Cr$_{0.3}$N | 0.3 | 5.3 |
| * 39 | | | | | | | 5.4 |
| * 40 | | | | | | | 5.8 |
| * 41 | | | | | | | 6.3 |
| * 42 | | | | | | | 9.3 |
| 43 | | | | | | | 12.3 |
| 44 | — | — | | 55.8 | Al$_{0.65}$Ti$_{0.1}$Cr$_{0.25}$N | 0.03 | 0.2 |
| * 45 | | | | | | 0.1 | 2.1 |
| * 46 | | | | | | 0.3 | 4.3 |
| * 47 | | | | | | 0.5 | 7.5 |
| * 48 | | | | | | 0.9 | 12.9 |
| 49 | | | | | | 1.5 | 19.0 |
| 50 | — | — | | — | None | 0 | 3.0 |
| 51 | — | — | | — | Al$_{0.67}$Cr$_{0.33}$N | 0.2 | 2.8 |
| 52 | — | — | | 0.7 | Al$_{0.75}$V$_{0.25}$N | 0.1 | 1.9 |

TABLE 3

| | B1 Compound Layer $(Ti_{1-xb1-yb1}Si_{xb1}M1_{yb1})(C_{1-zb1}N_{zb1})$ | | B2 Compound Layer $(Al_{1-xb2}M2_{xb2})(C_{1-zb2}N_{zb2})$ | | | | | |
|---|---|---|---|---|---|---|---|---|
| Coated cBN Tool | Composition | Average Thickness t1 (nm) | Composition | Average Thickness t2 (nm) | Number of Layers | Thickness of Entire B Layer (μm) | Crystal Structure | Particle Size Wb (nm) |
| Sample 1 | $Ti_{0.8}Si_{0.2}N$ | 4 | $Al_{0.7}Ti_{0.3}N$ | 6 | 200 | 1.0 | columnar crystal | 7 |
| * 2 | | | | | | | | |
| * 3 | | | | | | | | |
| * 4 | | | | | | | | |
| * 5 | | | | | | | | |
| 6 | | | | | | | | |
| 7 | $Ti_{0.9}Si_{0.1}N$ | 3 | $Al_{0.67}Cr_{0.33}N$ | 5 | 250 | 1.0 | columnar crystal | 20 |
| * 8 | | | | | | | | |
| * 9 | | | | | | | | |
| * 10 | | | | | | | | |
| * 11 | | | | | | | | |
| * 12 | | | | | | | | |
| 13 | | | | | | | | |
| 14 | TiN | 120 | $Al_{0.6}Cr_{0.4}N$ | 240 | 6 | 1.1 | columnar crystal | 150 |
| * 15 | $Ti_{0.97}Si_{0.03}N$ | | | | | | | 50 |
| 16 | $Ti_{0.9}Si_{0.1}N$ | | | | | | | 25 |
| 17 | $Ti_{0.85}Si_{0.15}N$ | | | | | | | 20 |
| * 18 | $Ti_{0.8}Si_{0.2}N$ | | | | | | | 15 |
| * 19 | $Ti_{0.76}Si_{0.24}N$ | | | | | | | 6 |
| 20 | $Ti_{0.7}Si_{0.3}$ | | | | | | | 2 |
| 21 | $Ti_{0.8}W_{0.1}Si_{0.1}N$ | 0.3 | $Al_{0.75}Cr_{0.2}V_{0.05}N$ | 0.3 | 3300 | 1.0 | columnar crystal | 3 |
| 22 | | 5 | | 5 | 200 | 1.0 | | 7 |
| 23 | | 20 | | 20 | 50 | 1.0 | | 15 |
| 24 | | 180 | | 180 | 6 | 1.1 | | 30 |
| 25 | | 250 | | 250 | 4 | 1.0 | | 60 |
| 26 | | 500 | | 500 | 2 | 1.0 | | 100 |
| 27 | $Ti_{0.7}Nb_{0.2}Si_{0.1}N$ | 10 | $Al_{0.2}Ti_{0.05}Cr_{0.75}N$ | 30 | 80 | 1.6 | columnar crystal | 30 |
| * 28 | | | $Al_{0.35}Ti_{0.05}Cr_{0.6}N$ | | | | | |
| * 29 | | | $Al_{0.5}Ti_{0.05}Cr_{0.45}N$ | | | | | |
| * 30 | | | $Al_{0.75}Ti_{0.05}Cr_{0.2}N$ | | | | | |
| 31 | | | $Al_{0.9}Ti_{0.05}Cr_{0.05}N$ | | | | | |
| 32 | $Ti_{0.9}Zr_{0.05}Si_{0.05}N$ | 0.3 | $Al_{0.78}V_{0.22}N$ | 0.3 | 2700 | 0.8 | columnar crystal | 3 |
| 33 | | 3 | | 4 | 230 | 0.8 | | 10 |
| 34 | | 10 | | 15 | 64 | 0.8 | | 18 |
| * 35 | | 100 | | 150 | 6 | 0.8 | | 25 |
| * 36 | | 200 | | 270 | 4 | 0.9 | | 35 |
| 37 | | 250 | | 450 | 2 | 0.7 | | 50 |
| 38 | $Ti_{0.7}Ta_{0.15}Si_{0.15}N$ | 3.5 | $Al_{0.7}Cr_{0.3}N$ | 5 | 6 | 0.03 | columnar crystal | 10 |
| * 39 | | | | | 20 | 0.1 | | |
| * 40 | | | | | 120 | 0.5 | | |
| * 41 | | | | | 240 | 1.0 | | |
| * 42 | | | | | 950 | 4.0 | | |
| 43 | | | | | 1650 | 7.0 | | |
| 44 | $Ti_{0.7}Al_{0.1}Si_{0.2}N$ | 2 | $Al_{0.65}Ti_{0.1}Cr_{0.25}N$ | 8 | 20 | 0.1 | columnar crystal | 5.2 |
| * 45 | | | | | 200 | 1.0 | | |
| 46 | | | | | 400 | 2.0 | | |
| 47 | | | | | 600 | 3.0 | | |
| * 48 | | | | | 800 | 4.0 | | |
| 49 | | | | | 1100 | 5.5 | | |
| 50 | None | — | None | — | — | 0 | — | — |
| 51 | $Ti_{0.9}Si_{0.1}N$ | 3 | $Al_{0.67}Cr_{0.33}N$ | 5 | 650 | 2.6 | columnar crystal | 10 |
| 52 | $Ti_{0.8}Si_{0.2}N$ | 5 | $Al_{0.75}V_{0.25}N$ | 3 | 250 | 1.0 | columnar crystal | 7 |

<Manufacture of Samples 7 to 13>

A base member was obtained in the same manner as with Sample 1 using a cBN sintered body D, and then, a D layer and a B layer each having a configuration shown in Tables 2 and 3 were stacked in this order on the base member while adjusting the film forming conditions as appropriate.

(Sample 7: Formation of A layer. $Ti_{0.9}Si_{0.1}CN^*$)

For Sample 7, an A layer including a $Ti_{0.9}Si_{0.1}CN$ layer having compositions of C and N changing in a step-like manner or in a slope-like manner in the thickness direction (the direction from the base member-side toward the coating film surface) was stacked on the B layer. In Table 2, the composition of the A layer is indicated as "$Ti_{0.9}Si_{0.1}CN^*$" for convenience. The specific configuration of the A layer is shown in Table 4. The A layer was formed as in the following manner.

First, 0.2 μm of a $Ti_{0.9}Si_{0.1}N$ layer was formed using only $N_2$ as introduced gas with film forming pressure set at 1.8 Pa. Then, 0.5 μm of a layer having a composition changing in a slope-like manner from $Ti_{0.9}Si_{0.1}N$ to $Ti_{0.9}Si_{0.1}C_{0.3}N_{0.7}$ was formed while gradually increasing the flow rate of $CH_4$ in the introduced gas. Then, 0.3 μm of a layer having a composition changing in a slope-like manner from $Ti_{0.9}Si_{0.1}C_{0.3}N_{0.7}$ to $Ti_{0.9}Si_{0.1}C_{0.5}N_{0.5}$ was formed while further increasing the flow rate of CH$_4$. Then, in the state where the flow rate ratio between N$_2$ and CH$_4$ was fixed, 0.5 μm of Ti$_{0.9}$Si$_{0.1}$C$_{0.5}$N$_{0.5}$ layer was formed. Then, 0.2 μm of a Ti$_{0.9}$Si$_{0.1}$N layer was formed using only N$_2$ as introduced gas again.

during formation of the A layer was changed. In this case, the heating temperature for the base member was set at 500° C. for Sample 10 as in the case of Sample 7, at 600° C. for Sample 11, at 650° C. for Sample 12, and at 700° C. for Sample 13.

TABLE 4

| Coated cBN Tool | A Layer | Step | Distance from Base Member-side (μm) | Composition |
|---|---|---|---|---|
| Sample 7 | Ti$_{0.9}$Si$_{0.1}$CN* | 1 | 0-0.2 | Ti$_{0.9}$Si$_{0.1}$N |
|  |  | 2 | 0.2-0.7 | Ti$_{0.9}$Si$_{0.1}$N→Ti$_{0.9}$Si$_{0.1}$C$_{0.3}$N$_{0.7}$ |
|  |  | 3 | 0.7-1.0 | Ti$_{0.9}$Si$_{0.1}$C$_{0.3}$N$_{0.7}$→Ti$_{0.9}$Si$_{0.1}$C$_{0.5}$N$_{0.5}$ |
|  |  | 4 | 1.0-1.5 | Ti$_{0.9}$Si$_{0.1}$C$_{0.5}$N$_{0.5}$ |
|  |  | 5 | 1.5-1.7 | Ti$_{0.9}$Si$_{0.1}$N |
| Sample 8 | Ti$_{0.95}$Si$_{0.05}$CN* | 1 | 0-0.2 | Ti$_{0.95}$Si$_{0.05}$N |
|  |  | 2 | 0.2-0.7 | Ti$_{0.95}$Si$_{0.05}$N→Ti$_{0.95}$Si$_{0.05}$C$_{0.3}$N$_{0.7}$ |
|  |  | 3 | 0.7-1.0 | Ti$_{0.95}$Si$_{0.05}$C$_{0.3}$N$_{0.7}$→Ti$_{0.95}$Si$_{0.05}$C$_{0.5}$N$_{0.5}$ |
|  |  | 4 | 1.0-1.5 | Ti$_{0.95}$Si$_{0.05}$C$_{0.5}$N$_{0.5}$ |
|  |  | 5 | 1.5-1.7 | Ti$_{0.95}$Si$_{0.05}$N |
| Sample 9 | Ti$_{0.99}$Si$_{0.01}$CN* | 1 | 0-0.2 | Ti$_{0.99}$Si$_{0.01}$N |
|  |  | 2 | 0.2-0.7 | Ti$_{0.99}$Si$_{0.01}$N→Ti$_{0.99}$Si$_{0.01}$C$_{0.3}$N$_{0.7}$ |
|  |  | 3 | 0.7-1.0 | Ti$_{0.99}$Si$_{0.01}$C$_{0.3}$N$_{0.7}$→Ti$_{0.99}$Si$_{0.01}$C$_{0.5}$N$_{0.5}$ |
|  |  | 4 | 1.0-1.5 | Ti$_{0.99}$Si$_{0.01}$C$_{0.5}$N$_{0.5}$ |
|  |  | 5 | 1.5-1.7 | Ti$_{0.99}$Si$_{0.01}$N |

In Table, for example, "Ti$_{0.9}$Si$_{0.1}$N→Ti$_{0.9}$Si$_{0.1}$C$_{0.3}$N$_{0.7}$" means that the composition changes from Ti$_{0.9}$Si$_{0.1}$N to Ti$_{0.9}$Si$_{0.1}$C$_{0.3}$N$_{0.7}$ in a slope-like manner.

(Sample 8: Formation of A layer. Ti$_{0.95}$Si$_{0.05}$CN*)

For Sample 8, an A layer including a Ti$_{0.95}$Si$_{0.05}$CN layer having compositions of C and N changing in a step-like manner or in a slope-like manner in the thickness direction (the direction from the base member-side toward the coating film surface) was stacked on the B layer. In Table 2, the composition of the A layer is indicated as "Ti$_{0.95}$Si$_{0.05}$CN*" for convenience. The specific configuration of the A layer is shown in Table 4. Furthermore, the A layer was formed in the same manner as with the A layer of Sample 7 described above except that, when forming the A layer of Sample 7, the composition of the metallic element in the A layer was changed from Ti:Si=0.9:0.1 to Ti:Si=0.95:0.05.

(Sample 9: Formation of A layer. Ti$_{0.99}$Si$_{0.01}$CN*)

For Sample 9, an A layer including a Ti$_{0.99}$Si$_{0.01}$CN layer having compositions of C and N changing in a step-like manner or in a slope-like manner in the thickness direction (the direction from the base member-side toward the coating film surface) was formed on the B layer. In Table 2, the composition of the A layer is indicated as "Ti$_{0.99}$Si$_{0.01}$CN*" for convenience. The specific configuration of the A layer is shown in Table 4. Furthermore, the A layer was formed in the same manner as with the A layer of Sample 7 described above except that, when forming the A layer of Sample 7, the composition of the metallic element in the A layer was changed from Ti:Si=0.9:0.1 to Ti:Si=0.99:0.01.

(Sample 10 to 13: Formation of A layer: TiCN*$^1$)

For each of Samples 10 to 13, an A layer including a TiCN layer having compositions of C and N changing in a step-like manner or in a slope-like manner in the thickness direction (the direction from the base member-side toward the coating film surface) was stacked on the B layer. In Table 2, the composition of the A layer is indicated as "TiCN*$^1$" for convenience. The specific configuration of the A layer is shown in Table 5. Furthermore, the A layer was formed in the same manner as with the A layer of Sample 7 described above except that, when forming the A layer of Sample 7, only Ti was used as a composition of the metallic element in the A layer and the heating temperature for the base member The coated cBN tools according to Samples 7 to 13 were obtained as described above.

TABLE 5

| Coated cBN Tool | A Layer | Step | Distance from Base Member-side (μm) | Composition |
|---|---|---|---|---|
| Samples 10 to 13 | TiCN*$^1$ | 1 | 0-0.2 | TiN |
|  |  | 2 | 0.2-0.7 | TiN→TiC$_{0.3}$N$_{0.7}$ |
|  |  | 3 | 0.7-1.0 | TiC$_{0.3}$N$_{0.7}$→TiC$_{0.5}$N$_{0.5}$ |
|  |  | 4 | 1.0-1.5 | TiC$_{0.5}$N$_{0.5}$ |
|  |  | 5 | 1.5-1.7 | TiN |
| Samples 27 to 31 | TiCN*$^2$ | 1 | 0-0.3 | TiN |
|  |  | 2 | 0.3-1.0 | TiC$_{0.2}$N$_{0.8}$ |
|  |  | 3 | 1.0-1.2 | TiC$_{0.4}$N$_{0.6}$ |
|  |  | 4 | 1.2-1.5 | TiN |
| Sample 46 (Steps 1 to 2: 1 Cycle) Sample 47 (Steps 1 to 3: 1 Cycle) Sample 48 (Steps 1 to 3: 2 Cycles) Sample 49 (Steps 1 to 3: 3 Cycles) | TiCN*$^3$ | 1 | 0-1.0 | TiC$_{0.1}$N$_{0.9}$ |
|  |  | 2 | 1.0-2.0 | TiC$_{0.1}$N$_{0.9}$→TiC$_{0.2}$N$_{0.8}$ |
|  |  | 3 | 2.0-4.0 | TiC$_{0.4}$N$_{0.6}$ |

In Table, for example, "TiN→TiC$_{0.3}$N$_{0.7}$" means that the composition changes from TiN to TiC$_{0.3}$N$_{0.7}$ in a slope-like manner.

<Manufacture of Sample 14>

A base member was obtained in the same manner as with Sample 1 using a cBN sintered body B, and then, a D layer having a configuration shown in Table 2 was formed on the base member while adjusting the film forming conditions as appropriate.

(Formation of B layer)

Then, a B1 compound layer and a B2 compound layer were alternately formed each for 3 times repeatedly under the conditions described below, with the result that a B layer formed of 6 layers in total and having a total thickness of 1.1 μm was stacked on the D layer.

(Formation of B1 Compound Layer)

The B1 compound layers each were formed to have a thickness of 120 nm by adjusting the vapor deposition time under the conditions described below.

Target: Ti
Introduced gas: $N_2$
Film forming pressure: 3.5 Pa
Arc discharge current: 140 A
Substrate bias voltage: −35V.

(Formation of B2 Compound Layer)

The B2 compound layers each were formed to have a thickness of 240 nm by adjusting the vapor deposition time under the conditions described below.

Target: Al (60 atom %), Cr (40 atom %)
Introduced gas: $N_2$
Film forming pressure: 3.5 Pa
Arc discharge current: 140 A
Substrate bias voltage: −60V.

(Formation of C layer)

After forming the B layer, a C layer having a thickness of 0.02 μm was stacked on the B layer by adjusting the vapor deposition time under the following conditions.

Target: Ti
Introduced gas: $N_2$
Film forming pressure: 0.5 Pa
Arc discharge current: 150 A
Substrate bias voltage: −500V (Formation of A layer)

Furthermore, an A layer having a configuration shown in Table 2 was stacked on the C layer while adjusting the film forming conditions as appropriate, thereby forming a coating film. Thereby, a coated cBN tool according to Sample 14 was obtained.

<Manufacture of Samples 15 to 20>

Coated cBN tools according to Samples 15 to 20 were obtained in the same manner as with Sample 14 except that each metallic element shown in Table 3 was used as a target for forming a B1 compound layer.

<Manufacture of Samples 21 to 26>

A base member was obtained in the same manner as with Sample 1 using a cBN sintered body C, and then, a D layer, a B layer and an A layer each having a configuration shown in Tables 2 and 3 were stacked in this order on the base member while adjusting the film forming conditions as appropriate, thereby forming a coating film, so that coated cBN tools according to Samples 21 to 26 were obtained. In this case, the B layer was formed by the same method as for Sample 1 in the case of Samples 21 to 23, and formed by the same method as for Sample 14 in the case of Samples 24 to 26.

<Manufacture of Samples 27 to 31>

A base member was obtained in the same manner as with Sample 1 using a cBN sintered body E, and then, a D layer and a B layer each having a configuration shown in Tables 2 and 3 were stacked in this order on the base member while adjusting the film forming conditions as appropriate. In this case, the B layer was formed by the same method as for Sample 1.

(Formation of A Layer. $TiCN^{*2}$)

For each of Samples 27 to 31, an A layer including a TiCN layer having compositions of C and N changing in a step-like manner in the thickness direction was stacked on the B layer. In Table 2, the composition of the A layer is indicated as "$TiCN^{*2}$" for convenience. The specific configuration of the A layer is shown in Table 5. As shown in Table 5, the A layer was formed while gradually changing the composition of the introduced gas for each prescribed thickness (step) from the base member-side (the cBN sintered body-side). Thereby, a coating film was obtained, in which the A layer including a TiCN layer having compositions of C and N changing in a step-like manner in the thickness direction was stacked on the B layer. Thereby, coated cBN tools according to Samples 27 to 31 were obtained.

<Manufacture of Samples 32 to 37>

A base member was obtained in the same manner as with Sample 1 using a cBN sintered body F, and then, a D layer, a B layer, a C layer, and an A layer each having a configuration shown in Tables 2 and 3 were stacked in this order on the base member while adjusting the film forming conditions as appropriate, to form a coating film. Thereby, coated cBN tools according to Samples 32 to 37 were obtained. In addition, the B layer was formed by the same method as for Sample 1 in the case of Samples 32 to 34, and formed by the same method as for Sample 14 in the case of Samples 35 to 37.

<Manufacture of Samples 38 to 43>

A base member was obtained in the same manner as with Sample 1 using a cBN sintered body G, and then, a D layer, a B layer and an A layer each having a configuration shown in Tables 2 and 3 were stacked in this order on the base member while adjusting the film forming conditions as appropriate, to form a coating film. Thereby, coated cBN tools according to Samples 38 to 43 were obtained. It is to be noted that the B layer was formed by the same method as for Sample 1.

<Manufacture of Samples 44 to 49>

A base member was obtained in the same manner as with Sample 1 using a cBN sintered body H, and then, a D layer and a B layer each having a configuration shown in Tables 2 and 3 were stacked in this order on the base member while adjusting the film forming conditions as appropriate. It is to be noted that the B layer was formed by the same method as for Sample 1.

(Formation of A Layer: $TiCN^{+3}$)

For each of Samples 46 to 49, an A layer including a TiCN layer having compositions of C and N changing in a step-like manner or in a slope-like manner in the thickness direction was stacked on the B layer. In Table 2, the composition of the A layer is indicated as "$TiCN^{*3}$" for convenience. The specific configuration of the A layer is shown in Table 5. As shown in Table 5, the A layer was formed while changing the composition of the introduced gas in a slope-like manner from the base member-side (the cBN sintered body-side) and then changing the composition of the introduced gas in a step-like manner.

For Sample 46, the flow rate ratio between $N_2$ and $CH_4$ in the introduced gas was first adjusted so as to be set at C:N=1:9 in a layer to be formed, thereby forming 1.0 μm of a $TiC_{0.1}N_{0.9}$ layer (step 1). Then, 1.0 μm of a TiCN layer having a composition of N decreasing in a slope-like manner (the composition of C increasing in a slope-like manner) was formed while gradually increasing the flow rate ratio of $CH_4$ (step 2).

For Sample 47, the process up to step 2 was performed similarly to Sample 46, and then, the flow rate ratio between $N_2$ and $CH_4$ in the introduced gas was adjusted so as to be set at C:N=4:6 in a layer to be formed, thereby further forming 2.0 μm of a $TiC_{0.4}N_{0.6}$ layer (step 3).

For Sample 48, after performing steps 1 to 3, layers according to steps 1 to 3 were again formed thereon, thereby forming an A layer having a total thickness of 8 μm. In Table 5, these steps 1 to 3 are defined as 1 cycle, and the process of repeating this 1 cycle twice is defined as "2 cycles". Then, for Sample 49, steps 1 to 3 were similarly repeated 3 times, thereby forming an A layer having a total thickness of 12 μm.

As described above, a coating film was formed by stacking, on the B layer, an A layer including a TiCN layer having compositions of C and N changing in a step-like manner or in a slope-like manner in the thickness direction, to thereby obtain coated cBN tools according to Samples 44 to 49.

<Manufacture of Sample 50>

A base member was obtained in the same manner as with Sample 1 using a cBN sintered body D, and then, an A layer having a configuration shown in Table 2 was formed on the base member while adjusting the film forming conditions as appropriate. Thereby, a coated cBN tool according to Sample 50 was obtained.

<Manufacture of Sample 51>

A base member was obtained in the same manner as with Sample 1 using a cBN sintered body D, and then, a D layer and a B layer each having a configuration shown in Tables 2 and 3 were formed in this order on the base member while adjusting the film forming conditions as appropriate. Thereby, a coated cBN tool according to Sample 51 was obtained. It is to be noted that the B layer was formed by the same method as for Sample 1.

<Manufacture of Sample 52>

A base member was obtained in the same manner as with Sample 1 using a cBN sintered body D, and then, a D layer, a B layer and an A layer each having a configuration shown in Tables 2 and 3 were formed in this order on the base member while adjusting the film forming conditions as appropriate. Thereby, a coated cBN tool according to Sample 52 was obtained. It is to be noted that the B layer was formed by the same method as for Sample 1.

<<Evaluations>>

The cutting performance and the surface roughness life of the coated cBN tool according to each of Samples 1 to 52, which was obtained as described above, were evaluated by high-speed continuous cutting of hardened steel.

<Measurement of Particle Size>

Each sample was cut and the cross section of the coating film was observed by a TEM, thereby confirming the shape of each of the crystal grains included in the A layer, the B layer and the C layer. Then, particle sizes Wa, Wb, and Wc were measured according to the above-described method. The results thereof are shown in Tables 2 and 3.

<Measurement of Flank Face Wear Amount VB and Surface Roughness Rz>

A tool for each Sample was used to perform cutting processing at a cutting distance of 4 km according to the cutting conditions described below. Then, a flank face wear amount VB of the tool was measured using an optical microscope. Furthermore, "ten-point average roughness (μm)" (that is, Rzjis) of the work material after processing was measured based on "JIS B 0601" and defined as surface roughness Rz. The results are shown in Table 6. In Table 6, the smaller the flank face wear amount VB is, the more the flank face wear resistance is excellent. Also, the smaller this Rz is, the more the boundary wear resistance is excellent, so that high precision processing can be implemented.

(Cutting Conditions)

Work material: SCM415H (HRC60) having an outer diameter of φ 30 and a cutting distance of 6.28 m per workpiece.

Cutting speed: 200 m/min
Feed rate: f=0.1 mm/rev
Cutting depth: ap=0.1 mm

Cutting oil: 20-fold diluted emulsion (trade name: "System Cut 96" manufactured by "Japan Fluid System") (wet cutting).

<Measurement of Surface Roughness Life>

Then, the surface roughness life in high precision processing was measured based on the life determination criterion defined as Rz=3.2 μm. Specifically, processing was repeatedly performed under the above-described cutting conditions; surface roughness Rz of the processed workpiece was measured using a surface roughness meter each time the processing for one workpiece (cutting distance: 6.28 m) ended; and then, the test was ended at the point of time when Rz exceeded 3.2 μm. Then, the total cutting distance (km) was calculated based on 6.28 m×number of workpieces. Furthermore, a scatter diagram was prepared in which the vertical axis shows Rz while the horizontal axis shows a cutting distance, to obtain the cutting distance at which Rz reached 3.2 μm on the straight line connecting two points of the end point and the point immediately before the end point in the scatter diagram. This obtained cutting distance was determined as a surface roughness life. The results thereof are shown in Table 6.

TABLE 6

| | Coated cBN Tool | Evaluation Results | | |
|---|---|---|---|---|
| | | At 4 km | | Based on Rz = 3.2 μm |
| | | Flank Face Wear Amount VB (mm) | Surface Roughness Rz (μm) | Surface Roughness Life (km) |
| | Sample 1 | 0.079 | 3.87 | 3.5 |
| * | Sample 2 | 0.067 | 2.76 | 8.5 |
| * | Sample 3 | 0.06 | 2.41 | 10.4 |
| * | Sample 4 | 0.063 | 2.48 | 10.1 |
| * | Sample 5 | 0.065 | 2.68 | 8.7 |
| | Sample 6 | 0.071 | 3.52 | 3.6 |
| | Sample 7 | 0.068 | 3.31 | 3.9 |
| * | Sample 8 | 0.064 | 2.53 | 9.8 |
| * | Sample 9 | 0.059 | 2.47 | 10.7 |
| * | Sample 10 | 0.058 | 2.32 | 10.8 |
| * | Sample 11 | 0.06 | 2.39 | 10.5 |
| * | Sample 12 | 0.062 | 2.59 | 9.6 |
| | Sample 13 | 0.07 | 3.34 | 3.8 |
| | Sample 14 | 0.073 | 3.5 | 3.4 |
| * | Sample 15 | 0.068 | 2.78 | 8.5 |
| * | Sample 16 | 0.065 | 2.63 | 9.6 |
| * | Sample 17 | 0.064 | 2.53 | 9.9 |
| * | Sample 18 | 0.064 | 2.61 | 9.7 |
| * | Sample 19 | 0.069 | 2.73 | 8.7 |
| | Sample 20 | 0.072 | 3.32 | 3.9 |
| | Sample 21 | 0.062 | 3.42 | 3.5 |
| * | Sample 22 | 0.06 | 2.39 | 10.4 |
| * | Sample 23 | 0.062 | 2.53 | 9.8 |
| * | Sample 24 | 0.067 | 2.67 | 9.4 |
| * | Sample 25 | 0.072 | 2.74 | 8.5 |
| | Sample 26 | 0.086 | 3.6 | 3.1 |
| | Sample 27 | 0.073 | 3.37 | 3.8 |
| * | Sample 28 | 0.069 | 2.58 | 8.5 |
| * | Sample 29 | 0.064 | 2.49 | 9.7 |
| * | Sample 30 | 0.062 | 2.43 | 10.2 |
| | Sample 31 | 0.079 | 3.65 | 3.3 |
| | Sample 32 | 0.072 | 3.59 | 3.2 |
| * | Sample 33 | 0.059 | 2.38 | 10.5 |
| * | Sample 34 | 0.061 | 2.42 | 10.3 |
| * | Sample 35 | 0.066 | 2.48 | 9.7 |
| * | Sample 36 | 0.07 | 2.65 | 8.3 |
| | Sample 37 | 0.082 | 3.82 | 3 |
| | Sample 38 | 0.075 | 3.61 | 3.1 |
| * | Sample 39 | 0.067 | 2.59 | 8.8 |
| * | Sample 40 | 0.063 | 2.4 | 10.4 |
| * | Sample 41 | 0.062 | 2.41 | 10.2 |
| * | Sample 42 | 0.065 | 2.55 | 9.4 |
| | Sample 43 | 0.072 | 3.56 | 3.6 |

TABLE 6-continued

| | | Evaluation Results | |
|---|---|---|---|
| | | At 4 km | Based on Rz = 3.2 μm |
| Coated cBN Tool | Flank Face Wear Amount VB (mm) | Surface Roughness Rz (μm) | Surface Roughness Life (km) |
| Sample 44 | 0.098 | 3.69 | 3.3 |
| * Sample 45 | 0.064 | 2.42 | 10 |
| * Sample 46 | 0.067 | 2.54 | 9.6 |
| * Sample 47 | 0.072 | 2.72 | 8.2 |
| * Sample 48 | 0.077 | 2.79 | 8 |
| Sample 49 | 0.103 | 3.9 | 2.8 |
| Sample 50 | 0.061 | 3.6 | 3.4 |
| Sample 51 | 0.094 | 3.72 | 3.1 |
| Sample 52 | 0.098 | 3.83 | 3 |

<<Results and Consideration>>

In Table 6, each Sample marked with a symbol "*" in the left-side column represents a coated cBN tool according to each of Examples. As apparent from Tables 1 to 6, it was confirmed that coated cBN tools according to Examples having the above-described configurations (1) to (10) each were excellent in flank face wear resistance and boundary wear resistance, and exhibited an excellent tool life in high precision processing of hardened steel, as compared with the tool not satisfying such conditions.

Furthermore, the findings obtained by analyzing the configuration of each Sample and the evaluation results in detail will be hereinafter described.

<Thickness of A Layer>

It was confirmed from the evaluation results of Samples 2 to 5 and 45 to 48 that Samples 3, 45 and 46 each having an A layer with a thickness of 1 μm or more and 3 μm or less tended to show a particularly excellent surface roughness life. Therefore, it is preferable that the thickness of the A layer is 1 μm or more and 3 μm or less.

<Particle Size Wa of Each of Columnar Crystals Forming a Layer>

According to the evaluations of Samples 8 to 12, it was confirmed that Samples 9 to 11 each having 50 nm or more and 300 nm or less of particle size Wa of each of the columnar crystals forming the A layer tended to show an excellent surface roughness life as compared with Samples 8 and 12 not satisfying such conditions. Therefore, it is preferable that Wa is 50 nm or more and 300 nm or less.

<Particle Size Wb of Each of Columnar Crystals forming B Layer>

According to the evaluations of Samples 15 to 19, it was confirmed that Samples 16 to 18 each having 7 nm or more and 40 nm or less of particle size Wb of each of the columnar crystals forming the B layer tended to show an excellent surface roughness life as compared with Samples 15 and 19 not satisfying such conditions. Therefore, it is preferable that Wb is 7 nm or more and 40 nm or less.

<Composition of B2 Compound Layer>

According to the evaluations of Samples 28 to 30, an excellent surface roughness life was exhibited in each of Samples 29 and 30 in which a B2 compound layer includes $(Al_{1-xb2}M2_{xb2})(C_{1-zb2}N_{zb2})$ where M2 represents at least one of Ti and Cr, and a composition xb2 of M2 is 0.25 or more and 0.5 or less, as compared with Sample 28 not satisfying such conditions. Therefore, it is preferable that composition xb2 of M2 is 0.25 or more and 0.5 or less.

<Thickness of B1 Compound Layer and B2 Compound Layer>

According to the evaluations of Samples 22 to 25 and Samples 33 to 36, it was confirmed that the surface roughness life tended to be improved in the case where the B layer included a compound layer of less than 30 nm (Samples 22, 23, 33, and 34). Therefore, it is preferable that the B layer is partially or entirely formed of a layer of less than 30 nm.

<Thickness of Entire B Layer>

According to the evaluations of Samples 39 to 42, Samples having an entire B layer thickness of 0.1 μm or more and 4 μm or less, particularly, Sample 40 having an entire B layer thickness of 0.5 μm and Sample 41 having an entire B layer thickness of 1.0 μm, each showed an especially excellent surface roughness life. Therefore, the thickness of the entire B layer is preferably 0.1 μm or more and 4 μm or less, and more preferably 0.5 μm or more and 4 μm or less.

Although the embodiments and examples according to the present invention have been described as above, the configurations of the embodiments and examples described above are intended to be combined as appropriate from the beginning.

It should be understood that the embodiments and examples disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 3 base member, 10 coating layer, 20 D layer, 30 B layer, 31 B1 compound layer, 32 B2 compound layer, 40 C layer, 50 A layer, t1 average thickness of B1 compound layers, t2 average thickness of B2 compound layers.

The invention claimed is:

1. A surface-coated boron nitride sintered body tool, in which at least a cutting edge portion includes a cubic boron nitride sintered body and a coating film formed on a surface of the cubic boron nitride sintered body,
   said cubic boron nitride sintered body comprising 30 vol % or more and 80 vol % or less of cubic boron nitride particles, and further comprising a binder phase including at least one compound selected from the group consisting of nitride, carbide, boride, oxide, and solid solutions thereof in group 4 elements, group 5 elements and group 6 elements in a periodic table, an aluminum compound, and inevitable impurities,
   said coating film including an A layer and a B layer,
   said A layer being formed of columnar crystals and including MLazai (M represents one or more of group 4 elements, group 5 elements and group 6 elements in the periodic table, Al and Si; La represents one or more of B, C, N, and O; and za1 is 0.85 or more and 1.0 or less),
   said B layer being formed of columnar crystals and formed by alternately stacking one or more of each of two or more compound layers having different compositions,
   said compound layers each having a thickness of 0.5 nm or more and 300 nm or less,
   said compound layers each having a thickness of 0.5 nm or more and 300 nm or less,
   one of said compound layers being a B1 compound layer,
       said B1 compound layer including $(Ti_{1-xb1-yb1}Si_{xb1}M1_{yb1})(C_{1-zb1}N_{zb1})$ (M1 represents one or more of group 4 elements except for Ti, group 5 elements and group 6 elements in the periodic table, and Al; xb1 is 0.01 or more and 0.25 or less; yb1 is 0 or more and 0.7 or less; and zb1 is 0.4 or more and 1 or less), one of said compound layers being a B2 compound layer, said B2 compound layer being different from said B1 compound layer, and including $(Al_{1-xb2}M2_{xb2})(C_{1-zb2}N_{zb2})$ (M2 represents one or more of group 4 elements, group 5 elements and group 6 elements in the periodic table, and Si; xb2 is 0.2 or more and 0.7 or less; and zb2 is 0.4 or more and 1 or less), said A layer having a thickness of 0.2 μm or more and 10 μm or less, said B layer having a thickness of 0.05 μm or more and 5 μm or less, and said coating film having an entire thickness of 0.3 μm or more and 15 μm or less, and a particle size Wa of each of said columnar crystals included in said A layer being 10 nm or more and 400 nm or less, and a particle size Wb of each of said columnar crystals included in said B layer being 5 nm or more and 70 nm or less.

2. The surface-coated boron nitride sintered body tool according to claim 1, wherein said A layer includes $(Ti_{1-xa}Ma_{xa})(C_{1-za2}N_{za2})$ (Ma represents one or more of group 4 elements except for Ti, group 5 elements and group 6 elements in the periodic table, Al and Si; xa is 0 or more and 0.7 or less; and za2 is 0 or more and 1 or less).

3. The surface-coated boron nitride sintered body tool according to claim 2, wherein, in said A layer, a composition za2 of N changes in a step-like manner or in a slope-like manner from a cubic boron nitride sintered body-side toward a surface-side of said A layer.

4. The surface-coated boron nitride sintered body tool according to claim 2, wherein said A layer includes, on the surface-side thereof, a region where a composition of C is larger than that on said cubic boron nitride sintered body-side.

5. The surface-coated boron nitride sintered body tool according to claim 1, wherein, in said B2 compound layer, said M2 represents at least one of Ti and Cr, and a composition xb2 of said M2 is 0.25 or more and 0.5 or less.

6. The surface-coated boron nitride sintered body tool according to claim 1, wherein said particle size Wa is 50 nm or more and 300 nm or less.

7. The surface-coated boron nitride sintered body tool according to claim 1, wherein said particle size Wb is 7 nm or more and 40 nm or less.

8. The surface-coated boron nitride sintered body tool according to claim 1, wherein said particle size Wa and said particle size Wb satisfy a relation of $1<Wa/Wb \leq 30$.

9. The surface-coated boron nitride sintered body tool according to claim 1, wherein said A layer is provided closer to a surface-side of said coating film than said B layer.

10. The surface-coated boron nitride sintered body tool according to claim 1, wherein said coating film further includes a C layer provided between said A layer and said B layer, said C layer includes $McLc_{zc}$ (Mc represents one or more of group 4 elements, group 5 elements and group 6 elements in the periodic table, Al and Si; Lc represents one or more of B, C, N, and O; and zc is 0 or more and 0.85 or less), and said C layer has a thickness of 0.005 μm or more and 0.5 μm or less.

11. The surface-coated boron nitride sintered body tool according to claim 10, wherein a composition zc of said Lc is more than 0 and less than 0.7.

12. The surface-coated boron nitride sintered body tool according to claim 10, wherein said C layer includes at least one or more of elements forming said A layer and said B layer.

13. The surface-coated boron nitride sintered body tool according to claim 10, wherein said C layer is formed of granular crystals, and a particle size Wc of each of the granular crystals is 5 nm or more and 300 nm or less.

14. The surface-coated boron nitride sintered body tool according to claim 1, wherein said coating film further includes a D layer provided between said cubic boron nitride sintered body and said B layer, and said D layer includes $MdLd_{zd}$ (Md represents one or more of group 4 elements, group 5 elements and group 6 elements in the periodic table, Al and Si; Ld represents one or more of B, C, N, and O; and zd is 0.85 or more and 1.0 or less).

15. The surface-coated boron nitride sintered body tool according to claim 1, wherein said cubic boron nitride sintered body contains 50 vol % or more and 65 vol % or less of said cubic boron nitride particles.

16. The surface-coated boron nitride sintered body tool according to claim 1, wherein at an interface between said cubic boron nitride sintered body and said coating film, said cubic boron nitride particles are shaped to protrude more to said coating film than to said binder phase, and a difference in level between said cubic boron nitride particles and said binder phase is 0.05 μm or more and 1.0 μm or less.

17. The surface-coated boron nitride sintered body tool according to claim 1, wherein said cubic boron nitride particles are increased in volume content from the interface between said cubic boron nitride sintered body and said coating film toward an inside of said cubic boron nitride sintered body.

18. The surface-coated boron nitride sintered body tool according to claim 1, wherein said cubic boron nitride particles are increased in particle size from the interface between said cubic boron nitride sintered body and said coating film toward the inside of said cubic boron nitride sintered body.

* * * * *

UNITED STATES PATENT AND TRADEMARK OFFICE
CERTIFICATE OF CORRECTION

PATENT NO. : 9,850,177 B2
APPLICATION NO. : 14/892542
DATED : December 26, 2017
INVENTOR(S) : Nozomi Tsukihara et al.

It is certified that error appears in the above-identified patent and that said Letters Patent is hereby corrected as shown below:

- Claim 1, Column 30, Line 53: "MLazai" should be -- $MLa_{za1}$ --
- Claim 13, Column 32, Line 20: "particle size We" should be -- particle size Wc --

Signed and Sealed this
Fourteenth Day of August, 2018

Andrei Iancu
*Director of the United States Patent and Trademark Office*